United States Patent
Yang et al.

(10) Patent No.: US 6,440,878 B1
(45) Date of Patent: Aug. 27, 2002

(54) METHOD TO ENHANCE THE ADHESION OF SILICON NITRIDE TO LOW-K FLUORINATED AMORPHOUS CARBON USING A SILICON CARBIDE ADHESION PROMOTER LAYER

(75) Inventors: Hongning Yang, Vancouver, WA (US); Tue Nguyen, Fremont, CA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/541,255

(22) Filed: Apr. 3, 2000

(51) Int. Cl.$^7$ .............................................. H01L 21/31
(52) U.S. Cl. ........................ 438/783; 438/758; 438/761
(58) Field of Search .................................. 438/787, 790, 438/783, 761, 758

(56) References Cited

U.S. PATENT DOCUMENTS

| | | | | |
|---|---|---|---|---|
| 4,634,648 A | * | 1/1987 | Jansen | 430/84 |
| 6,066,196 A | * | 5/2000 | Kaloyeros et al. | 106/1.18 |
| 6,104,092 A | * | 8/2000 | Matsubara et al. | 257/764 |
| 6,121,162 A | * | 9/2000 | Endo | 438/787 |
| 6,246,105 B1 | * | 7/2001 | Morozumi et al. | 257/640 |
| 6,265,319 B1 | * | 7/2001 | Jang | 438/723 |

OTHER PUBLICATIONS

Article entitled, "Integration Studies of Plasma Deposited Fluorinated Amorphous Carbon" by T.W. Mountsier, J. A. Samuels and R.S. Swope at the Low Dielectric Constant Materials IV Symposium, 04/14–16/98, pp. 259–264.

* cited by examiner

Primary Examiner—David Nelms
Assistant Examiner—Thao P Le
(74) Attorney, Agent, or Firm—David C. Ripma; Matthew D. Rabdau; Scott C. Krieger

(57) ABSTRACT

A plasma enhanced chemical vapor deposition (PECVD) process is provided for depositing one or more dielectric material layers on a substrate for use in interconnect structures of integrated circuits. The method comprises the steps of depositing a fluorinated amorphous carbon (a-F:C) layer on a substrate by providing a fluorine containing gas, preferably octafluorocyclobutane, and a carbon containing gas, preferably methane, in ratio of approximately 5.6, so as to deposit a a-F:C layer having an internal compressive stress of approximately 28 MPa After deposition the film is annealed at approximately 400° C. for approximately two hours. An adhesion promoter layer of relatively hydrogen-free hydrogeneated silicon carbide is then deposited on the a-F:C layer using silane ($SiH_4$) and methane ($CH_4$) as the deposition gases. The silicon carbide layer may be deposited at a rate of approximately 180 Å per minute and typically results in deposition of a silicon carbide layer having an internal compressive stress of approximately 400 MPa. The deposited silicon carbide layer has relatively few hydrogen bonds thereby yielding a compact structure which promotes adhesion of the a-F:C layer to a silicon nitride layer and to the a-F:C layer, and which reduces diffusion of fluorine through the silicon carbide layer. A silicon nitride layer is then deposited on the adhesion promoter layer, the deposition materials preferably comprising silane ($SiH_4$) and nitrogen ($N_2$) in a ratio of 30:100 at 400° C. The silicon nitride layer formed has relatively few hydrogen bonds thereby resulting in a layer having an internal compressive stress of approximately 240 MPa This stacked layer structure has thermal stability and resists peeling and cracking up to 450° C., and the a-F:C dielectric layer has a dielectric constant (k) as low, or lower, than 2.5.

11 Claims, 6 Drawing Sheets

Fig. 3
| a-F:C FILM FLOW RATE RATIO (C4F8/CH4) | FILM STRESS (MPa) (AS DEPOSITED) | FILM STRESS (MPa) (ANNEALED) | ADHESION TEST |
|---|---|---|---|
| 4.4 | "-75 | "+30 | PEELING |
| 5.6 | "-28 | "+30 | GOOD |
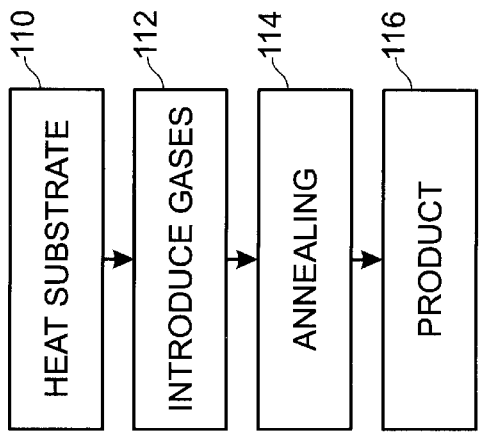
Fig. 6
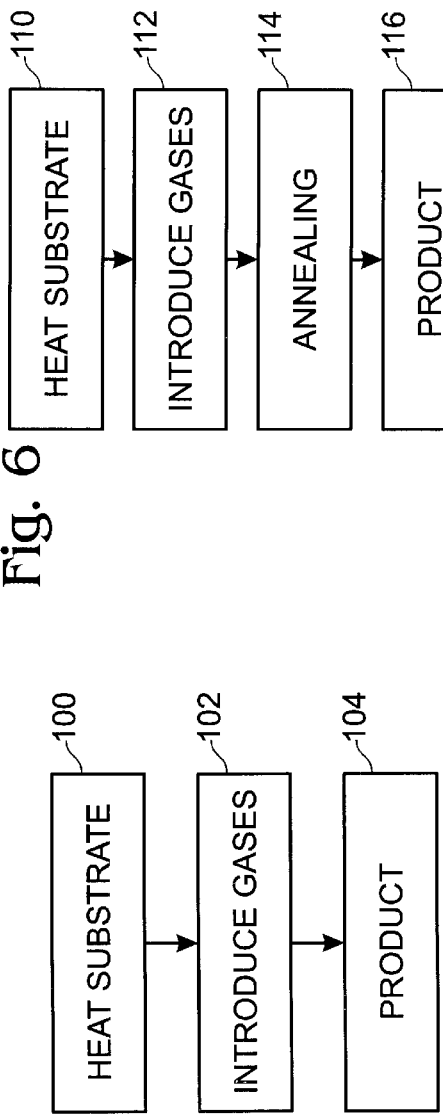
Fig. 4
Fig. 5
| | STRESS (MPa) | DEPOSITION AT 400°C (Å/MIN) | THERMAL STABILITY AT 400°C MARGINALLY STABLE? |
|---|---|---|---|
| DLC | "-2000 | >10 | MARGINALLY STABLE |
| SIC | "-400 | "180 | STABLE |

Fig. 7
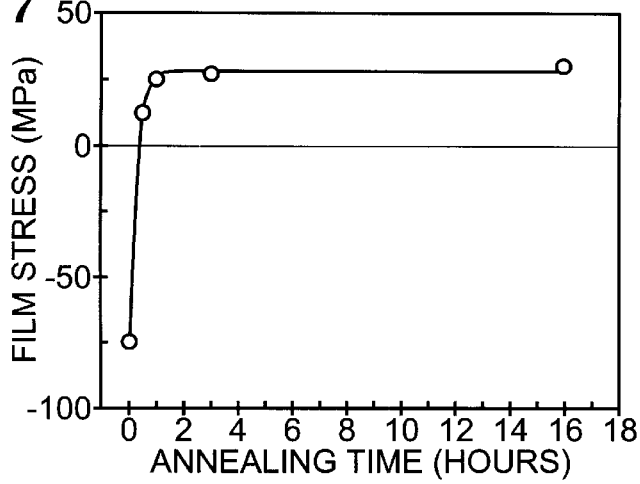
Fig. 8
| Si$_3$N$_4$ DEPOSITION FLOW RATE RATIO | DEPOSITION TEMPERATURE | CHEMICAL BONDINGS | STRESS (MPa) | ADHESION TEST |
|---|---|---|---|---|
| SiH$_4$:N$_2$:NH$_3$ = 73.5:272.5:10 | 400°C | Si-N, N-H | +240 | CRACKING |
| SiH$_4$:N$_2$ =73.5:272.5 (SiH$_4$/N$_2$ = 0.539) | 400°C | Si-N, N-H | -300 | PEELING |
| SiH$_4$:N$_2$ =73.5:136.2 (SiH$_4$/N$_2$ = 0.270) | 400°C | Si-N, Si-Si | -240 | GOOD |
| SiH$_4$:N$_2$ =73.5:272.5 (SiH$_4$/N$_2$ = 0.539) | 250°C | Si-N, Si-H | -10 | PEELING |
Fig. 9
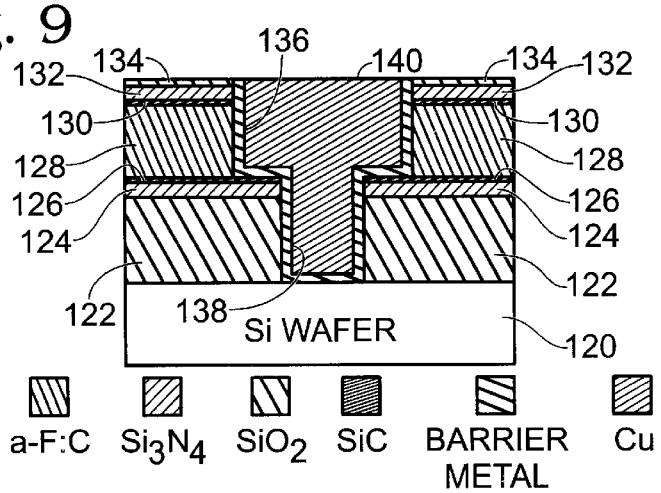

METHOD TO ENHANCE THE ADHESION OF SILICON NITRIDE TO LOW-K FLUORINATED AMORPHOUS CARBON USING A SILICON CARBIDE ADHESION PROMOTER LAYER

FIELD OF THE INVENTION

This invention relates to a method of integrating chemical vapor deposition copper (Cu) with low-k fluorinated amorphous carbon (a-F:C) in single level and multilevel damascene structures, and more particularly, to a method of providing a thin layer of an adhesion promoter material, such as relatively hydrogen-free hydrogenated silicon carbide (SiC:H), between layers of silicon nitride ($Si_3N_4$) and a-F:C to enhance the adhesion and mechanical properties of the damascene structure.

BACKGROUND OF THE INVENTION

The designers and makers of large scale integrated circuits continue to make ever-smaller devices which allow for greater speed and increased device packing densities. The size of individual features (e.g., the transistor gate length) on ultra-large-scale (ULSI) circuits is shrinking to less than 0.25 microns. The resultant increase in packing densities on semiconductor chips, and the associated increase in functionality, has greatly increased the number and density of interconnects on each chip.

Smaller on-chip devices, packed closer together, with increased functionality and complexity, require interconnects (lines, vias, etc.) which are smaller, more complex (e.g., more wiring levels), and more closely-spaced. The smaller sizes of the interconnects, which increases resistance, and closer interconnect spacing, leads to resistance-capacitance (RC) coupling problems including propagation delays and cross talk noise between inter-level conductors. As interconnect lines, both inter-level and intra-level, become smaller and more closely spaced, RC delays become an increasing part of the total signal delays, offsetting any speed advantage derived from smaller device sizes. RC delays thus limit improvement in device performance. Small conductor size increases the resistivity (R) of metal lines and smaller inter-line and inter-level spacing increases the capacitance (C) between lines. Use and development of lower-resistivity metals such as copper will continue to reduce the resistivity of interconnect lines. Capacitance can be reduced by employing lower dielectric constant (i.e., lower-k) dielectric materials.

Since capacitance (C) is directly proportional to the dielectric constant (k) of the interconnect dielectric, RC problems presented by ULSI circuits can be reduced if a low-dielectric-constant (low-k) material is used as the insulating material disposed between and around the inter-level and intra-level conductors (the dielectric being referred to herein as the "interconnect dielectric" or the "interconnect dielectric material"). Industry is seeking a suitable replacement for silicon dioxide ($SiO_2$), which has long been used as a dielectric in integrated circuits. Silicon dioxide has excellent thermal stability and relatively good dielectric properties, having a dielectric constant of around 4.0. But there is now a need for an interconnect dielectric material which is suitable for use in IC circuit interconnects and which has a lower dielectric constant than does $SiO_2$.

After a long search for possible low dielectric constant materials to be used as an interconnect dielectric in ULSI circuits, the candidates have been narrowed down to a few, depending upon the desired application. One of the promising materials, which has been actively studied recently and has received considerable attention, is fluorinated amorphous carbon (a-F:C).

The dielectric constant of a-F:C films is lowered as the fluorine concentration in the material is increased. In the plasma enhanced chemical vapor deposition process (PECVD) process, the fluorine concentration of the films depends on the fluorine to carbon ratio in the discharge, which is established by the feed gas composition, RF power input, substrate temperature, and total pressure. The thermal stability is closely related to the degree of cross-linking among the polymer chains. The greater the degree of cross-linking, the more tightly bound the structures are, and the higher the thermal stability. In the PECVD process, either raising the substrate temperature, enhancing the ion bombardment, or applying a low frequency plasma energy, can increase the cross-linking in the fluorocarbon films. Higher temperature deposition has the disadvantage of inevitably reducing the fluorine concentration, thereby increasing the dielectric constant Moreover, higher temperature deposition also leads to poor adhesion between the polymer layer and the $SiO_2$ and $Si_3N_4$ layers due to increased thermal stress, and causes higher leakage current in the films.

Fluorinated amorphous carbon has a dielectric constant k below 3.0 and, depending on the proportion of fluorine (F) in the film, can have a dielectric constant in the range of 2.0 to 2.5. Early experience with these polymers shows that films deposited at room temperature may have a dielectric constant as low as 2.1 and thermal stability up to 300 C. Further experimentation showed that if the a-F:C films were deposited at higher substrate temperatures, the thermal stability could be improved up to 400 C., but the dielectric constant increased above ~2.5. It has heretofore not been possible to prepare a-F:C films with suitable low-dielectric-constant properties (k less than 2.5), and a thermal stability above 400° C. Temperatures in the sintering range (450° C.), typical for manufacturing ULSI chips, cause excessive shrinkage of the a-F:C film, probably due to fluorine volatilization. Mechanical strength and adhesion problems also are obstacles to the use of a-F:C as an interconnect in high-density integrated circuits. In particular, the poor adhesion between a-F:C and the barrier layer, such as silicon nitride ($Si_3N_4$), has been a problem for years.

Recent research and development on low dielectric constant (low-k) materials indicates that the integration of Cu with low-k materials is one of the key issues in choosing candidates for future interlayer dielectrics in single-level and in multi-level damascene structures. Although many low-k candidates show excellent electrical properties, a successful Cu/low-k integration has still not been accomplished due to difficulties in the fabrication of Cu/low-k based damascene structures. In these structures, the major reliability issues are the adhesion of low-k films, such as a-F:C, with $SiO_2$, $Si_3N_4$ and barrier layers (liners), the mechanical strength of the low-k materials during chemical mechanical polishing (CMP), and the stability of the single and multi-level damascene structures under heat treatment, patterning and plasma etching. Since multilevel wiring is the ultimate goal for the Cu/low-k interconnection, fabrication of such multi-level damascene structures is critical.

Accordingly, it would be advantageous to have a dielectric material, alternatively referred to herein as an "interconnect dielectric," for use in interconnect structures of integrated circuits which has a low dielectric constant (k=3.0 or less) and improved thermal stability (up to 450° C.), thus providing a suitable lower-k replacement for silicon dioxide dielectric.

It would also be advantageous to have a a-F:C film which has a dielectric constant of 2.5 or less which is thermally stable to 450° C.

It would also be advantageous to have a method of forming low-k a-F:C films on silicon substrates using plasma enhanced chemical vapor deposition (PECVD) techniques, wherein the resultant a-F:C film is substantially stable up to 450° C.

It would further be advantageous to have a method of forming multiple a-F:C films on silicon substrates wherein the resultant multiple layered a-F:C/$Si_3N_4$ structure is stable up to 450° C.

It would be advantageous to have a method of forming a thin layer of promoter material, such as SiC, to enhance the adhesion and mechanical properties of a-F:C films with $SiO_2$ and/or $Si_3N_4$ layers.

It would be advantageous to have a method of forming a promoter layer which may also serve as a barrier to reduce diffusion of fluorine atoms through the layered structure.

It would be advantageous to have a method of forming $Cu/SiO_2$/a-F:C damascene stacking layers that can sustain the processes of CMP, heat treatment, patterning and plasma etching.

SUMMARY OF THE INVENTION

A plasma enhanced chemical vapor deposition (PECVD) process is provided for depositing one or more dielectric material layers on a substrate for use in interconnect structures of integrated circuits. The method comprises the steps of depositing a fluorinated amorphous carbon (a-F:C) layer on a substrate by providing a fluorine containing gas, preferably octafluorocyclobutane, and a carbon containing gas, preferably methane, in a ratio of approximately 5.6, so as to deposit a a-F:C layer having an internal compressive stress of approximately 28 MPa After deposition the film is annealed at approximately 400° C. for approximately two hours and results in the layer having an internal tensile stress of approximately 30 MPa.

An adhesion promoter layer of relatively hydrogen free hydrogeneated silicon carbide is then deposited on the a-F:C layer by providing a silicon containing gas, preferably silane, and a carbon containing gas, preferably methane, in a flow ratio of approximately 0.735. The deposition typically takes place at a pressure of approximately 2.4 Torr, a high frequency power of 200 Watts and 13.56 MHz, a low frequency power of 200 Watts and 500 KHz, and a temperature of approximately 400° C. The silicon carbide layer may be deposited at a rate of approximately 180 Å per minute and typically results in deposition of a silicon carbide layer having an internal compressive stress of approximately 400 MPa The conditions of the deposition result in a deposited silicon carbide layer that has relatively few silicon-hyrogen bonds thereby yielding a compact structure which promotes adhesion of the damascene structure layers to one another and which reduces diffusion of fluorine through the silicon carbide layer.

A silicon nitride layer is then deposited on the adhesion promoter layer, the deposition materials preferably comprising silane ($SiH_4$) and nitrogen ($N_2$) in a flow ratio of 0.539 at 400° C. The silicon nitride layer formed has relatively few silicon-hydrogen bonds thereby resulting in a layer having an internal compressive stress of approximately 240 MPa. This stacked layer structure has thermal stability and resists peeling and cracking up to 450° C., and the a-F:C layer has a dielectric constant as low, or lower, than 2.5.

BRIEF DESCRIPTION OF THE INVENTION

FIG. 3 is a table showing the properties of several materials used to deposit the a-F:C layer;

FIG. 4 is a block diagram illustrating the steps in the process for depositing the silicon carbide adhesion promoter layer on the a-F:C layer;

FIG. 5 is a table showing the properties of several materials used to deposit the adhesion promoter layer;

FIG. 6 is a block diagram illustrating the steps in the process for depositing the silicon nitride layer on the silicon carbide adhesion promoter layer, FIG. 7 is graph showing the film stress of the a-F:C layer with respect to the annealing time;

FIG. 8 is a table showing the properties of several materials used to deposit the silicon nitride layer;

FIG. 9 is a schematic drawing of a one-level dual damascene structure produced by the method of the present invention;

DETAILED DESCRIPTION OF THE INVENTION

The present invention provides a process for depositing fluorinated amorphous carbon (a-F:C) on a silicon wafer substrate. The wafer substrate, at the time the steps in the method are carried out, has been processed by well-known techniques (not shown) to produce integrated circuit (IC) features (e.g., transistors and other active and passive devices) on the wafer. The type and number of integrated circuit features on the substrate are unimportant to the process of the present invention, except that the low-k fluorinated amorphous carbon dielectric material is most advantageously employed on ultra-large-scale-integration (ULSI) high-density ICs. The dielectric material is used in conjunction with interconnect structures, such as conductive lines and vias which are well known conductive interconnect features typically formed in, and extending through, the interconnect dielectric film which is deposited on the wafer, including the a-F:C dielectric deposited in the method of the present invention. The form, architecture, and conductive material used in the interconnect structures, as well as the methods of forming such structures, are not described herein and are a matter of design choice well known to those skilled in the art. This invention relates to a method of forming a suitable low-dielectric-constant (low-k) dielectric film which is deposited on the wafer and is suitable for use between and around the conductive lines, vias, and other conductors in ULSI and similar ICs.

Figure 1:
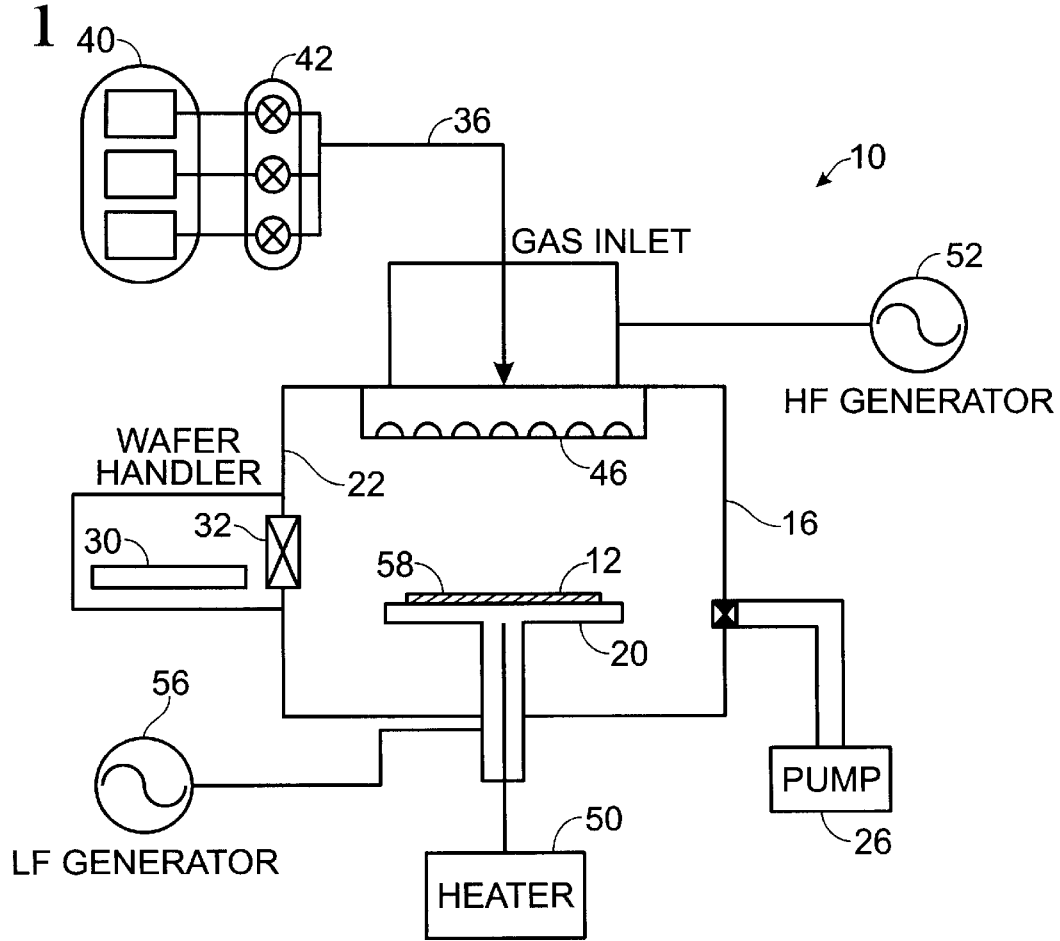
FIG. 1 is a schematic depiction of a PECVD chamber of the present invention.

FIG. 1 is a schematic depiction of a PECVD chamber for carrying out the selected steps in the process of the present invention. Apparatus 10 is suitable for carrying out a plasma enhanced chemical vapor deposition (PECVD) on a substrate such as a wafer 12. Apparatus 10 includes a PECVD chamber 16 of a size suitable for holding one or more wafers 12, which are supported in the chamber on a chuck 20. As is typical of such chambers, the interior 22 can be evacuated or pressurized as desired by a suitable pump and valve apparatus schematically illustrated as pump 26. Individual wafers 12 are moved in and out of chamber 16 by a suitable wafer handler 30 through a gate valve 32 in the chamber wall, allowing wafers to be moved onto chuck 20 for processing, and then removed from the chamber.

Selected gases used during the PECVD processing are introduced into the chamber through a suitable manifold system 36 from various gas supply reservoirs indicated collectively at 40, controlled by valves 42. The gasses are introduced into the chamber through what is called a shower head 46, which distributes the gases as required. Chuck 20 can be heated to any desired temperature, the heating element for this purpose being schematically depicted as heater 50. The heater and chuck are used to select the temperature of wafer 12 during the PECVD processing.

Plasma energy is supplied to the chamber through an RF generator 52 which supplies high frequency (HF) RF power radiated through shower head 46. The industry standard for HF plasma energy used in PECVD chambers is 13.56 megahertz (MHz), although the invention is not limited to any exact frequency value. Apparatus 10 preferably also includes a low frequency (LF) generator 56 for supplying LF power to the interior of the chamber. LF power is used to increase crosslinking in the amorphous fluorinated carbon (a-F:C) film deposited on wafer 12 during PECVD processing.

Figure 2:
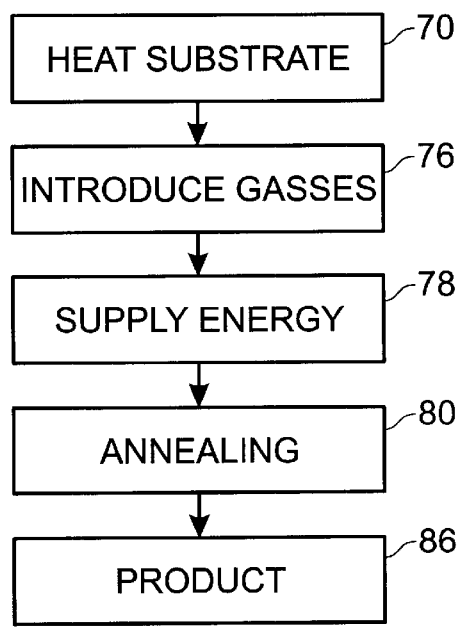
FIG. 2 is a block diagram illustrating the steps in the process for depositing a fluorinated amorphous carbon layer on a substrate in a PECVD chamber as shown in FIG. 1, in accordance with the present invention.

FIG. 2 is a block diagram illustrating the steps in the process for depositing a fluorinated amorphous carbon layer on a substrate in the PECVD chamber, in accordance with the present invention. With reference to both FIGS. 1 and 2, a wafer substrate 12 is first positioned on chuck 20 in PECVD chamber 16 by wafer handler 30. Apparatus 10 preferably comprises an OXFORD Plasmalab 100 system, through any suitable apparatus may be utilized. Substrate 12 typically is a silicon wafer prepared for receiving the a-F:C film, the a-F:C being deposited on an upper surface 58 of the wafer. The first step shown in FIG. 2 is step 70, which is the heating of substrate 12 to a temperature above 200° C. Preferably, wafer 12 is heated to a temperature generally in the range of 200° C. to 300° C., and more preferably, to a temperature of approximately 250° C. The power supplied during this deposition step typically involves a dual frequency RF discharge.

The second step 76 is the introduction of a flow of fluorine containing gas (FCG) and carbon containing gas (CCG) into chamber 16 via manifold 36 from suitable supplies 40. The ratio of FCG to CCG is selected to deposit fluorinated amorphous carbon on the substrate. The preferred fluorine containing gas (FCG) used in the process of the present invention is octafluorocyclobutane ($C_4F_8$). The preferred carbon containing gas (CGC) used in the process is methane ($CH_4$). A suitable ratio of FCG to CCG for the deposit of fluorinated amorphous carbon on the substrate is generally in the range of between 5.5 and 5.7, and, more preferably, approximately 5.6. The 5.6 ratio may also be described in terms of flow rate, i.e., a octafluorocyclobutane flow rate of 112 cubic centimeters per minute (sccm), and a methane flow rate of 20 sccm. The ambient pressure maintained in the PECVD chamber during the introduction of FCG and CCG into the chamber is preferably generally in the range of 0.3 Torr to 0.5 Torr, and more preferably, approximately 0.4 Torr.

Sufficient energy is applied in step 78 to chamber 16 to form a fluorine and carbon gas plasma in the chamber. Plasma power including HF energy at approximately 13.56 MHz (as is standard in the industry) is supplied to the chamber 16, at an energy level of between 150 and 250 Watts, and more preferably approximately 200 Watts, and LF energy, at a frequency generally in the range of 5 KHz to 50 KHz, and typically at a LF energy of 10 KHz, at an energy level of between 150 and 250 Watts, and more preferably approximately 200 Watts.

As is known to those skilled in PECVD processing, the plasma energy in chamber 16 ionizes the introduced gases generating polymer radicals which are deposited on surface 58 of wafer 12. $C_4F_8$ provides discharge of two kinds of long-life radicals. One is the fluorocarbon radical ($CF_x$) (where $1<\!/\!=\!x\!>\!/\!=\!2$), which is the building block for a-F:C deposits. The others are F and $F_2$ atoms, which are destructive etchants that form volatile fluorides which weaken the a-F:C film deposited on substrate 12. The methane added to the chamber serves to discharge the hydrogen (H) radicals, which can tie up fluorine (F) atoms by forming volatile HF, thereby reducing etching from the F and $F_2$ atoms and improving the stability of the resultant a-F:C film deposited on the wafer. The deposition rate and the fluorine concentration of the a-F:C film are selectively controlled by the flow rates of the FCG and the CCG gases, as well as the chamber pressure within chamber 16. As noted above, the ratio of FCG to CCG is generally approximately 5.6. The ambient pressure maintained within chamber 16 during steps 76 and 78 is preferably in the range of 0.3 Torr to 0.5 Torr.

During steps 76 and 78, a a-F:C film is deposited having a film compressive stress in a range of 18 MPa to 38 MPa, and more preferably approximately 28 MPa (as deposited). The process further comprises step 80, in which the deposited a-F:C film is annealed at a temperature of approximately 400° C. for an appropriate time period, depending on the thickness of the deposited a-F:C film. For a typical film having a thickness of approximately 0.5 microns, a two hour annealing period at 400° C. is desirable. The annealed film typically will have an internal film tensile stress in the range of 20 MPa to 40 MPa, and more preferably approximately 30 MPa (annealed), which results in a film having a thermal stability at temperatures up to and greater than 400° C. The amorphous fluorinated carbon deposited on wafer 12, which is the product 86 of the first phase of the present invention, is used to generate a stacked layer structure having a low-k dielectric material and greater thermal stability than a-F:C films deposited with other gases, and at other ratios, than the product deposited at the desired ratio of 5.6 $C_4F_8$ to $CH_4$, as described herein.

Thermal stability is generally defined as minimal-to-zero shrinkage (e.g., less than 1% shrinkage) of the deposited a-F:C film during the high temperature anneal which is carried out upon completion of the inter-level interconnects on the IC wafer. It is advantageous in IC wafer fabrication to be able to anneal the fabricated wafer at a temperature above 440° C. for a minimum of approximately twenty minutes, and preferably between thirty minutes and up to several hours. The anneal is generally a part of the completion process for the devices on the wafer. One significant problem with the use of a-F:C dielectrics on IC wafers has been their poor thermal stability during anneals over 350° C. to 400° C., and at even greater temperatures. Fluorinated amorphous carbon films in stacked layer structures deposited using prior art processes, when subjected to high temperature anneals (greater than 440° C.), exhibit undesirable shrinkage, for example 2.0% to 5.0% or more. The present invention is able to provide a-F:C stacked layer structures with good thermal stability (minimal to zero shrinkage) at final anneals greater than 440° C. and typically having shrinkage values less than approximately 1.0%.

FIG. 3 is a table showing the properties of several materials used to deposit the a-F:C layer. As shown, an inlet gas ration of 4.4 produces a film which peels during the adhesion tests. The benefit of providing the FCG ($C_4F_8$) and the CCG ($CH_4$) gases in a ratio of approximately 5.6 is that the ratio is believed to help in the production of a film having less compressive stress, approximately 28 MPa as deposited (wherein a negative stress indicates a compressive stress and wherein a positive stress indicates a tensile stress), than films produced with different inlet gas ratios (such as $C_4F_8/CH_4$ at a ratio of 4.4) which produces a film having a compressive stress of approximately -75 MPa. Both films have a stress of approximately 30 MPa after annealing. However, the film produced with the inlet gas ratio of 5.6 does not peel during the standard tape test, whereas the film produced with the inlet gas ratio of 4.4 peels during the standard tape test. In other words, the film deposited at a ratio of 5.6, which results in a film having a lower internal film stress, resists peeling and results in thermal stability at temperatures over 400° C.

FIG. 4 is a block diagram illustrating the steps in the process for depositing the silicon carbide adhesion promoter layer on the a-F:C layer formed as described with reference to FIG. 2. Product 86 of FIG. 2, i.e., the substrate having a single a-F:C layer deposited thereon, is positioned on chuck 20 in PECVD chamber 16 by wafer handler 30. The first step shown in FIG. 4 is step 100, which is the heating of substrate 12 to the deposition temperature. Preferably, wafer 12 is heated to a temperature generally in the range of 300° C. to 500° C., and more preferably, to a temperature of approximately 400° C.

The second step 102 is the introduction of a flow of silane ($SiH_4$) and methane ($CH_4$) into chamber 16 via manifold 36 from suitable supplies 40. A silicon carbide film is deposited on substrate 12 at a deposition temperature of approximately 400° C. at a rate in a range of 100 Å per minute to 300 Å per minute, and typically at a rate of approximately 180 Å per minute. The ambient pressure maintained in the PECVD chamber during the deposition of silicon carbide is preferably generally in the range of 0.3 Torr to 0.5 Torr, and more preferably, approximately 0.4 Torr. The power supplied during the deposition of the silicon carbide film typically is a HF power of 200 Watts and 13.56 MHZ, and a LF power of 200 Watts and 500 KHz.

During steps 100 and 102, a silicon carbide film is deposited having an internal compressive film stress in a range of 350 MPa to 450 MPa, and more preferably approximately 400 MPa (as deposited). The layer of silicon carbide preferably is deposited to a thickness in a range of 50 Å to 300 Å, and preferably having a thickness of approximately 100 Å. These process variables result in a silicon carbide film having a compact structure with very little hydrogen contained therein. The product is shown as 104. The low level of hydrogen in the film is believed to result in a tighter/more compact silicon carbide structure which resists breakdown at temperatures up to and above 400° C. In addition, it is believed that the tightly compact, essentially hydrogen-free, silicon carbide structure (having relatively little hydrogen complexed therein) also provides fewer channels for the diffusion of fluoride therethrough than does loosley packed hydrogenated silicon carbide structures. Accordingly, the inventive process results in a stacked layered structure having a thermal stability up to and above 400° C. Moreover, the silicon carbide layer of the present invention has a thermal stability greater than a film of diamond-like-carbon (DLC) which typically is deposited at a relatively slow rate of less than 10 Å per minute, has an internal stress of approximately -2000 MPa, and which is only marginally stable at temperatures of 400° C. or greater.

FIG. 5 is a table showing the properties of several materials used to deposit the adhesion promoter layer. The table shows that a diamond like carbon (DLC) film is only marginally stable at 400° C. whereas the silicon carbide film is stable at 400° C.

FIG. 6 is a block diagram illustrating the steps in the process for depositing a silicon nitride layer on product 104 having the low level hydrogen-silicon carbide adhesion promoter layer deposited on the a-F:C layer. The first step 110 comprises heating substrate 12 to an appropriate temperature. The temperature maintained in the PECVD chamber during the introduction of the deposition gases into the chamber is preferably generally in the range of 350° C. to 450° C., and more preferably, approximately 400° C. The second step 112 includes providing the deposition gases to chamber 16. The preferred silicon containing gas (SCG) used in the process of the present invention is silane ($SiH_4$). The preferred nitrogen containing gas (NGC) used in the process is nitrogen gas ($N_2$). A suitable ratio of SCG to NCG for the deposit of silicon nitride on the silicon carbide adhesion promoter layer is generally in the range of between 30:50 and 30:200, and, more preferably, a ratio of approximately 30:100. This ratio can also be described as a SCG flow rate of 73.5 sccm and a NGC flow rate of 136.2 sccm. The third step 114 includes annealing the sandwiched layers at a temperature in the range of 300° C. to 450° C., and preferably at a temperature of approximately 400° C., for approximately four hours. This process results in silicon-nitrogen and silicon-silicon bonds in the silicon nitride layer, i.e., a silicon-rich and essentially hydrogen-free silicon nitride film, shown as product 116. The silicon nitride film is deposited having an internal tensile film stress in a range of 5 MPa to 15 MPa, and more preferably approximately 10 MPa, by conducting the deposition with use of only a high frequency power input of approximately 13.56 MHz. Using a high frequency power input decreases the biased voltage on the substrate so that the ion bombardment on the a-F:C film can be significantly reduced. It is believed that the relatively hydrogen-free make up of the deposited silicon nitride film is a result of forming the film under such high frequency. power input conditions. In other words, the use of LF power (500 KHz or less, and preferably 100 KHz or less) should be avoided during this deposition step. The sandwiched layers are then cooled down to room temperature for conducting a tape test. Testing of the sandwiched layers in standard tape tests shows that the deposited film has good adhesion qualities and avoids peeling and cracking of the film.

FIG. 7 is graph showing the film stress of the a-F:C layer with respect to the annealing time of the film. In particular, the thermal annealing step changed the stress of the a-F:C film from a compressive stress (less than zero) to a tensile stress (greater than zero). The internal stress of the silicon nitride film deposited on substrate 12 should match the internal stress of the a-F:C film in order to reduce the shearing stress in the structure including both the a-F:C and the $Si_3N_4$ films. Accordingly, it is desirable to deposit the silicon nitride film with a slight tensile stress, such as a stress of approximately 10 MPa as described above. The similar internal stresses of the deposited a-F:C and $Si_3N_4$ films results in a stacked layer structure that resists peeling and cracking of the film during high temperature conditions.

FIG. 8 is a table showing the properties of several materials used to deposit the silicon nitride layer. A flow rate ratio of 73.5:272:10 for $SiH_4:N_2:NH_3$ at a deposition temperature of 400° C. results in a film having N—H bonds, an internal stress of +240 MPa, and which cracks during the adhesion test. A flow rate ratio of 73.5:272.5 for $SiH_4:N_2$ at a deposition temperature of 400° C. results in a film having N—H bonds, an internal stress of −300 MPa, and which peels during the adhesion test. A flow rate ratio of 73.5:272.5 for $SiH_4:N_2$ at a deposition temperature of 250° C. results in a film having Si—H bonds, an internal stress of −10 MPa, and which peels during the adhesion test. The flow rate ratio of 73.5:136.2 for $SiH_4:N_2$ at a deposition temperature of 400° C. results in a film having no Si—H or N—H bonds, an internal stress of −24 MPa, and which does not peel or crack during the adhesion test.

EXAMPLE

The a-F:C and SiC:H films were deposited in a commercial PECVD system, namely an OXFORD Plasmalab 100 system. Highly crosslinked a-F:C films were obtained at 250° C. utilizing a dual frequency RF discharge and then conducting a post thermal treatment. The thickness and refractive index of the a-F:C and SiC:H films were determined by a spectroscopic ellipsometer (SENTECH Instruments Gmbh). Fourier Transformation Infrared (FTIR) and X-ray Photo Spectrum (XPS) tests were employed to determine, respectively, the bonding and chemical concentration of the films.

An isothermal test of the thermal stability of the stacked layer structure was performed in a vacuum chamber with a base pressure of $10^5$ Torr, wherein a deposited wafer was annealed on a heated chuck for a time period of approximately two hours, a time fluctuation of ~2%, and a temperature non-uniformity of less than 5° C. An adhesion test was conducted by the standard tape-pulling test and by chemical-mechanical polishing (CMP).

Metal organic chemical vapor deposition (MOCVD) copper was deposited using a Cu-hfac-tmvs precursor with a high deposition rate of approximately 2000 Å per minute, a low resistivity of approximately 2 $\mu\Omega$-cm, good adhesion, and good gap fill. Excellent adhesion of the MOCVD copper film to a titanium nitride (TiN) diffusion barrier film was achieved through a combination of process and equipment design, as will be understood by those skilled in the art.

The patterning of the a-F:C stacking layers was conducted using conventional plasma etching methods with oxygen ($O_2$). A thin PECVD oxide was utilized as the hard-mask material to protect the a-F:C film during plasma etching and resist stripping steps. Titanium nitride (TiN) was sputtered as the diffusion barrier before the copper deposition step. The copper was patterned using the standard CMP method with commercially available systems and slurries. A two-step polishing process was used to reduce the shearing stress on the surface of the structure and to prevent cracking of the to structure during polishing.

FIG. 9 is a schematic of a typical one-level dual damascene structure produced by the method of the present invention, wherein Cu is filled in both the via and the trench lines. The structure comprises: silicon wafer substrate 120; a silicon dioxide ($SiO_2$) layer 122; a silicon nitride ($Si_3N_4$) layer 124; a silicon carbide (SiC) layer 126; a fluorinated amorphous carbon (a-F:C) layer 128; a silicon carbide (SiC) layer 130; a silicon nitride ($Si_3N_4$) layer 132; a silicon dioxide ($SiO_2$) layer 134; a barrier metal 136 such as TiN; a via 138 comprised of copper (Cu); and a trench 140 comprised of copper (Cu).

In the via contact layer 138, a 0.5 $\mu$m thick layer 122 of $SiO_2$ is used as the dielectric layer 122. For the layer of line connection 140, low-k a-F:C layer 128 is used for the inter-metal dielectric. The top layer 134 of $SiO_2$ (0.1 $\mu$m) is used as a hardmask. The thin layers 124 and 132 (~0.05 $\mu$m) of $Si_3N_4$ are inserted between the $SiO_2$ and a-F:C layers 122, 128 and 134, which can serve as an etching stop and a Cu diffusion barrier.

It is well known that the adhesion between a-F:C and $Si_3N_4$ is poor. Accordingly, an adhesion promotion layer 126 and/or 130 of SiC:H material is chosen as an adhesion promoter. In particular, the SiC:H film can be deposited in a PECVD process using a mixture of $SiH_4$ and hydrogen carbon gas such as $C_2H_2$, $C_2H_6$ or $CH_4$. The quality of the SiC:H as an adhesion promoter layer depends on the concentration of Si—H bonds in the film. The amount of Si—H bonds can be controlled by adjusting the deposition conditions, such as the deposition temperature, the bias power and the gas flow ratio.

Figure 10:
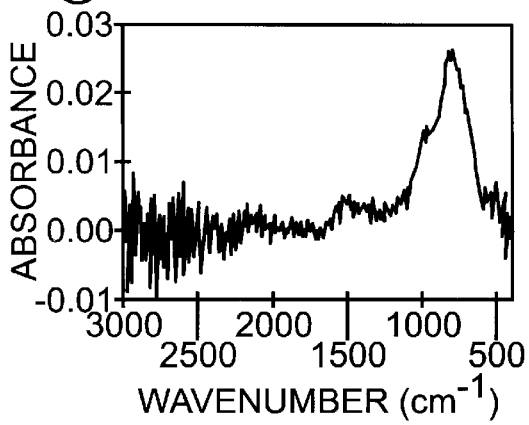
FIG. 10 is a FTIR spectrum of a silicon carbide film of the present invention containing relatively few Si—H bonds.
Figure 11:
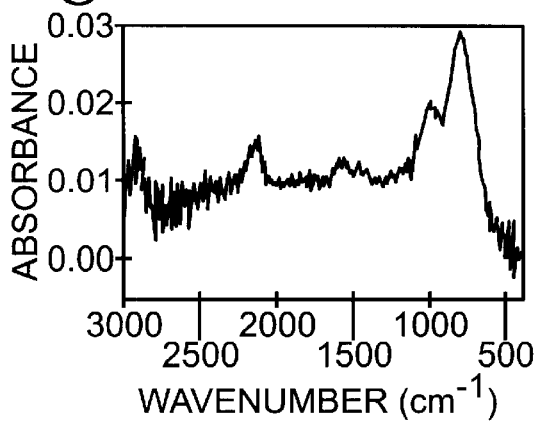
FIG. 11 is a FTIR spectrum of a silicon carbide film of the present invention containing relatively more Si—H bonds than the film of FIG. 10.

FIG. 10 is a FTIR spectrum of a silicon carbide film of the present invention containing relatively few Si—H bonds and FIG. 11 is a FTIR spectrum of a silicon carbide film containing relatively more Si—H bonds. In particular, the peak at approximately 2270 $cm^{-1}$ is normally associated with the vibration of Si—H bonds. Accordingly, the film shown in FIG. 10 contains fewer Si—H bonds compared with the film shown in FIG. 11. To examine which film has better adhesion properties, anneal tests were performed at approximately 400° C. for 3 hours on two kinds of stacking layer structures, shown in FIGS. 12 and 13.

Figure 12:
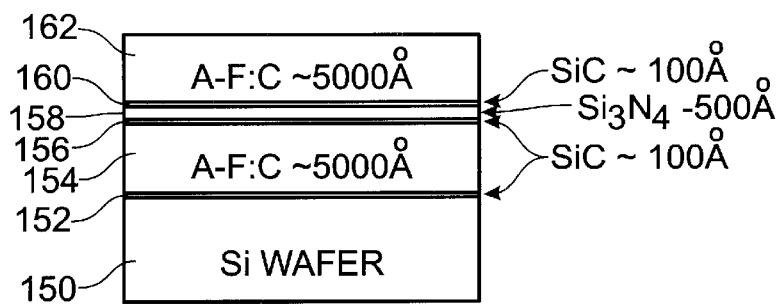
FIG. 12 is a schematic of a layered structure of the present invention used in the adhesion and stability tests, wherein the structure includes two a-F:C layers.
Figure 13:
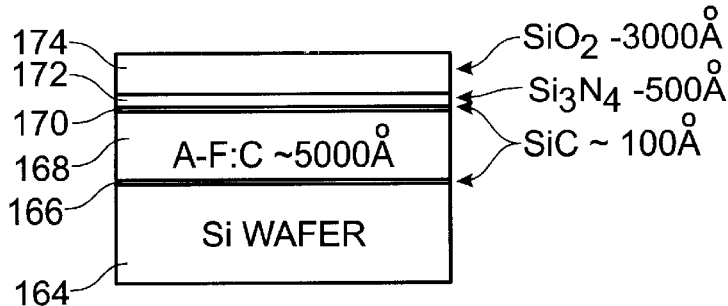
FIG. 13 is a schematic of another layered structure of the present invention used in the adhesion and stability tests, wherein the structure includes one a-F:C layer.

FIG. 12 is a schematic of a layered structure of the present invention used in the adhesion and stability tests, wherein the structure includes two a-F:C layers and FIG. 13 is a schematic of another layered structure of the present invention used in the adhesion and stability tests, wherein the structure includes one a-F:C layer. The structure shown in FIG. 12 is used to test the vertical diffusion of fluorine atoms from either top or bottom a-F:C layers. The structure comprises: a silicon wafer substrate 150; a silicon carbide (SiC) layer 152 having a thickness of approximately 100 Å; a fluorinated amorphous carbon (a-F:C) layer 154 having a thickness of approximately 5000 Å; a silicon carbide (SiC) layer 156 having a thickness of approximately 100 Å; a silicon nitride ($Si_3N_4$) layer 158 having a thickness of approximately 500 Å; a silicon carbide (SiC) layer 160 having a thickness of approximately 100 Å; and a fluorinated amorphous carbon (a-F:C) layer 162 having a thickness of approximately 5000 Å.

The structure shown in FIG. 13 is a stacking layer structure used to fabricate the damascene structure wherein a top $SiO_2$ layer is utilized as a hardmask. The structure comprises: a silicon wafer substrate 164; a silicon carbide (SiC) layer 166 having a thickness of approximately 100 Å;

a fluorinated amorphous carbon (a-F:C) layer 168 having a thickness of approximately 5000 Å; a silicon carbide (SiC) layer 170 having a thickness of approximately 100 Å; a silicon nitride ($Si_3N_4$) layer 172 having a thickness of approximately 500 Å; and a silicon dioxide ($SiO_2$) layer 174 having a thickness of approximately 3000 Å.

Using the SiC:H layered structures of both FIGS. 12 and 13, having minimal Si—H bonds as shown in FIG. 10, no blistering or peeling was observed. The testing structures of both FIGS. 9 and 10 also passed the standard tape pull tests after annealing. In contrast, use of the SiC:H layered structures of FIGS. 12 and 13, having Si—H bonds as shown in FIG. 11, resulted in both blistering and peeling of the layered structures after annealing. The adhesion failure of the structures is believed to be attributed to the presence of Si—H, bonds as described with respect to FIG. 11.

It is concluded that the SiC:H films having fewer Si—H bonds exhibit better adhesion properties. This can be understood in that the presence of silicon-hydrogen (and/or nitrogen-hydrogen) bonds tend to terminate the crosslinking network connection between adjacent silicon atoms and creates a more open internal structure. The higher concentration of silicon-hydrogen bonds in a SiC:H film thus not only reduces the adhesive bonding in the interface but also fails to effectively block the diffusion of fluorine atoms through the SiC film. The main reason for the adhesion failure in the test could be due to the reaction between fluorine and $Si_3N_4$ when the fluorine atoms diffuse through the SiC:H layer. Therefore, it is desirable to have a SiC:H film with minimal Si—H bonds, which can have a fully crosslinked and compacted structure so as to contain the a-F:C film and to prevent the diffusion of fluorine atoms into the $Si_3N_4$ layer. Accordingly, the present invention provides a method of depositing a stacked layer structure having reduced silicon-hydrogen bonds in the silicon carbide layers.

Figure 14:
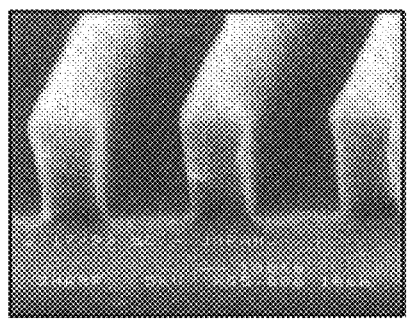
FIG. 14 is a SEM cross sectional image of a single damascene structure of the present invention after etching.
Figure 15:
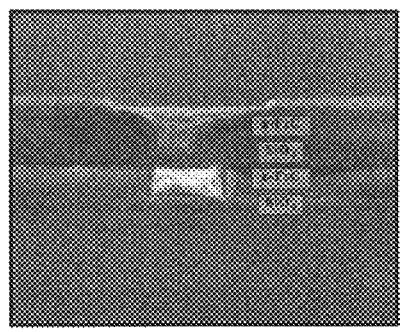
FIG. 15 is a SEM cross sectional image of a two-level damascene structure of the present invention after chemical mechanical polishing.

FIG. 14 is a scanning electron microscope (SEM) cross sectional image of a single damascene structure of the present invention after etching, and FIG. 15 is a SEM cross sectional image of a two-level damascene structure of the present invention after chemical mechanical polishing. After photoresist patterning on the damascene stacking layers, the $SiO_2$ in the trench lines is plasma etched first to open a window. Both the underlayer a-F:C film and the top photoresist can then be etched away simultaneously using $O_2$ chemistry. In particular, FIG. 14 is an SEM cross section image for a single damascene structure after etching. Note that a sufficient thickness of the $SiO_2$ hardmask layer is very important for protecting the underlayer a-F:C film from being undercut during plasma etching. Although the top hardmask layer shows overcut (which should be polished thinner after CMP), the underlayer does not exhibit severe undercut.

After TiN and Cu CVD deposition steps, the step of CMP polishing is used to test the adhesion and mechanical strength of the damascene stacking layer structure. It is found that using the SiC:H film with minimal Si—H bonds as an adhesion layer (as shown in FIG. 10), the stacking layer is able to sustain the CMP process. Such a test can be further extended to multilevel damascene structures.

Referring to FIG. 15, the figure shows a SEM cross section image of a two-level damascene structure after CMP. Note that a sufficient thickness of the $SiO_2$ hardmask layer is also important for protecting the underlayer a-F:C film from CMP slurry erosion.

Figure 16:
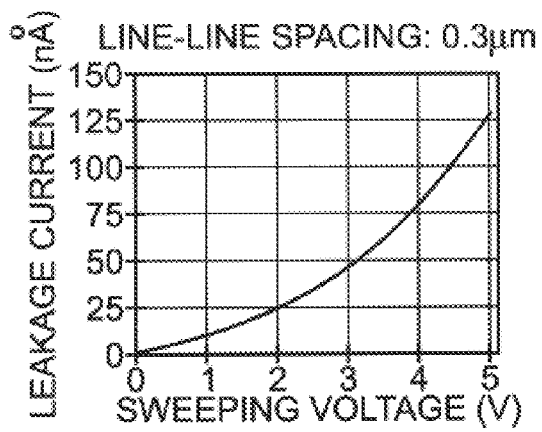
FIG. 16 is graph showing the line-line leakage of current measured from a comb structure.
Figure 17:
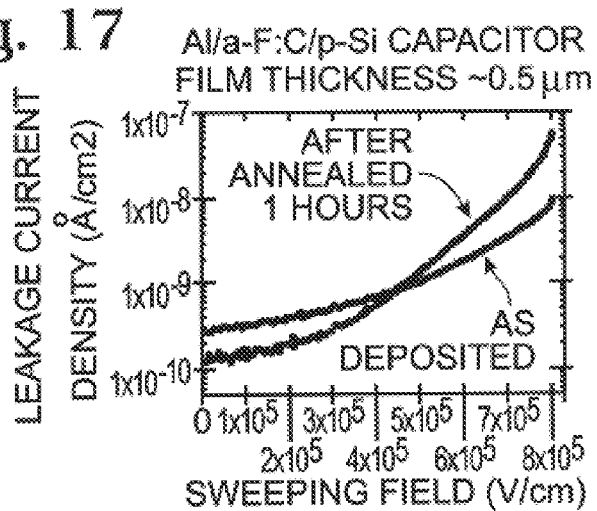
FIG. 17 is a graph showing the leakage current measured from an Al/a-F:C/p-SI MOS capacitor.

FIG. 16 is graph showing the line-line leakage of current measured from a comb structure and FIG. 17 is a graph showing the leakage current measured from an Al/aF:C/p-SI MOS capacitor. Measurement of the line-line leakage current was performed on the comb circuit patterned in a Cu/a-F:C based single damascene structure. FIG. 16 shows a plot of the line leakage current as a function of the sweeping voltage. For a line spacing of 0.3 µm in the comb structure, a typical leakage current of ~3–5×10$^{-8}$ A was obtained at an operation voltage of 2.5 V. For comparison, FIG. 14 shows the leakage current measured from a Al/a-F:C/p-Si MOS capacitor, where, at an electric field of 0.8×10$^6$ V/cm, the leakage current density was on the order of 10$^8$ A/cm$^2$ before and after annealing at 400° C.

Figure 18:
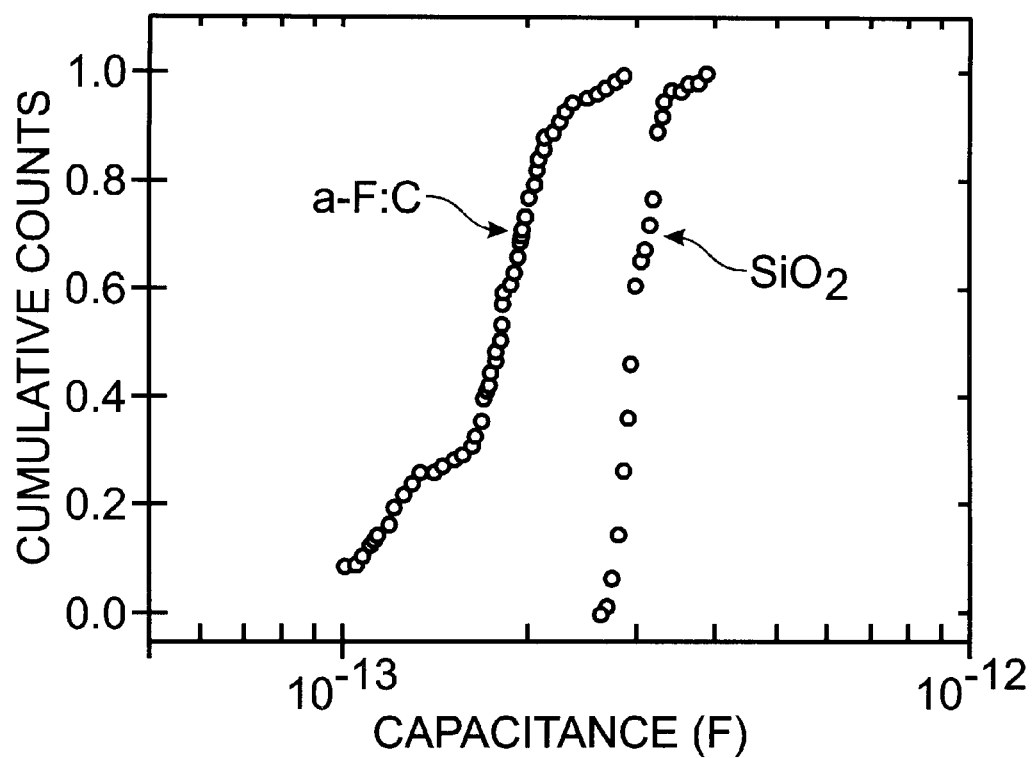
FIG. 18 is a graph showing the statistical distribution of measured line capacitance.

FIG. 18 is a graph showing the statistical distribution of the measured line capacitance. The line-line capacitance from the comb circuit patterned in the Cu/a-F:C based single damascene structure is measured to compare the measurements with that of the Cu/$SiO_2$ based single damascene structure. The figure shows the statistical distribution of the measured line capacitance from both damascene structures. For the Cu/a-F:C structure, the average capacitance is about 0.22 nF, while for the CU/$SiO_2$ structure, the average capacitance is about 0.30 nF. Therefore, the low-k a-F:C film reduces the line-line capacitance by about 25%. (For the a-F:C film, k~2.5; and for the $SiO_2$ film, k~4.0.) Note that, in FIG. 18, the distribution of capacitance for a-F:C film is broader, which could be due to the non-uniform thickness of the a-F:C film deposited in the present small PECVD system.

In summary, the integration process of a CVD Cu with a low-k a-F:C film in single level and multilevel damascene structures has been demonstrated. In particular, a thin layer of an adhesion promoter material, such as SiC:H with minimal Si—H bonds, can be utilized to enhance the adhesion and mechanical properties of the damascene stacking layers. The SiC:H layer may also serve as a barrier to contain fluorine atoms from diffusion. Testing indicates that the a-F:C based damascene stacking layers are able to sustain the processes of CMP, heat treatment, patterning and plasma etching. The feasibility for the fabrication of multi-level damascene structures is thus successfully demonstrated. Finally, the evaluation of the line leakage current and capacitance on the damascene structures is also presented, which show reasonably good electrical performance of the low-k a-F:C dielectric structures.

Thus, methods of forming a damascene structure having improved thermal stability, and the structure itself, have been disclosed. Although preferred methods of forming the structure have been disclosed, it should be appreciated that further variations and modifications may be made thereto without departing from the scope of the invention as defined in the appended claims.

We claim:

1. A method of fabricating an integrated circuit, comprising the steps of:

providing a substrate;

depositing a fluorinated amorphous carbon layer on the substrate;

depositing a silicon carbide layer on the fluorinated amorphous carbon layer; and depositing a silicon nitride layer on the silicon carbide layer.

2. The method of claim 1 wherein said step of depositing said silicon carbide layer includes providing silane ($SiH_4$) and a carbon containing gas in a flow ratio of 0.735, and wherein said carbon containing gas is chosen from the group consisting of $C_2H_4$, $C_2H_6$ and $CH_4$.

3. The method of claim 1 wherein said silicon carbide layer is deposited having an internal compressive stress in a range of 300 to 500 MPa and a compact, essentially hydrogen-free structure.

4. The method of claim 1 wherein said silicon carbide layer is deposited at a rate in a range of 150 to 250 angstroms per minute and wherein said silicon carbide layer has a final thickness of at least 50 angstroms.

5. The method of claim 1 wherein each of the depositing steps takes place in a plasma enhanced chemical vapor deposition chamber at a temperature in a range of 200 to 500° C.

6. The method of claim 1 wherein the step of depositing said fluorinated amorphous carbon layer includes providing octafluorocyclobutane ($C_4F_8$) and a hydrogen-carbon gas in a ratio range of 5.5 to 5.7, and wherein said hydrogen-carbon gas is chosen from the group consisting of $C_2H_4$, $C_2H_6$ and $CH_4$.

7. The method of claim 1 further comprising the step of annealing said fluorinated amorphous carbon layer at a temperature of at least 350° C. for at least fifty minutes, and wherein said fluorinated amorphous carbon layer has an internal compressive stress in a range of 18 to 38 MPa prior to annealing, has an internal tensile stress in a range of 20 to 40 MPa after annealing, and has a dielectric constant of 2.5 or less.

8. The method of claim 1 wherein the step of depositing said silicon nitride layer includes providing silane ($SiH_4$) and nitrogen ($N_2$) in a ratio range of 30:50 to 30:150, and providing a high frequency power of approximately 13.56 MHz but not providing a low frequency power less than 1000 KHz.

9. The method of claim 1 further comprising the step of heating the substrate having the fluorinated amorphous carbon layer, the silicon carbide layer, and the silicon nitride layer thereon, to a temperature in a range of 350 to 500° C. for at least one hour, wherein the fluorinated amorphous carbon layer, the silicon carbide layer, and the silicon nitride layer do not blister or peel away from one another during or after said heating step.

10. The method of claim 1 wherein the silicon carbide layer as deposited has a compact, essentially hydrogen-free structure which inhibits diffusion of fluorine therethrough.

11. A method of fabricating an integrated circuit, comprising the steps of:

providing a substrate;

depositing a single fluorinated amorphous carbon layer on the substrate;

depositing a silicon carbide layer directly on the single fluorinated amorphous carbon layer; and depositing a silicon nitride layer on the silicon carbide layer.

* * * * *